United States Patent
Nakamura et al.

(10) Patent No.: US 7,297,757 B2
(45) Date of Patent: Nov. 20, 2007

(54) RESIN SURFACE TREATING AGENT AND RESIN SURFACE TREATMENT

(75) Inventors: Sachiko Nakamura, Amagasaki (JP); Yoshinari Miyata, Amagasaki (JP); Terukazu Ishida, Amagasaki (JP); Miho Misumi, Amagasaki (JP)

(73) Assignee: Mec Company Ltd., Hyogo (JP)

( * ) Notice: Subject to any disclaimer, the term of this patent is extended or adjusted under 35 U.S.C. 154(b) by 44 days.

(21) Appl. No.: 11/153,968

(22) Filed: Jun. 16, 2005

(65) Prior Publication Data

US 2005/0279253 A1    Dec. 22, 2005

(30) Foreign Application Priority Data

Jun. 18, 2004    (JP) ............................. 2004-181407

(51) Int. Cl.
  *C08F 6/00*    (2006.01)
(52) U.S. Cl. .............. 528/480; 106/286.1; 106/287.24; 106/287.27; 427/331
(58) Field of Classification Search ............ 106/286.1, 106/287.24, 287.27; 427/331; 528/480
   See application file for complete search history.

(56) References Cited

U.S. PATENT DOCUMENTS 4,689,433 A    8/1987    Foa et al.
5,527,618 A    6/1996    Graiver et al.
6,190,780 B1 *    2/2001    Shoji et al. ................. 428/472

FOREIGN PATENT DOCUMENTS

| JP | 3-56541 | | 3/1991 |
|---|---|---|---|
| JP | 2002-30460 | * | 1/2002 |
| JP | 2002-167696 | * | 6/2002 |
| WO | WO 91/16377 | | 10/1991 |
| WO | WO 03/027208 | * | 4/2003 |

* cited by examiner

*Primary Examiner*—Terressa Boykin
(74) *Attorney, Agent, or Firm*—Hamre, Schumann, Mueller & Larson, P.C.

(57) ABSTRACT

The present invention relates to a resin surface treating agent containing as an effective component at least one cerium compound selected from tetravalent and trivalent cerium compounds. The surface treating method of the present invention is a method of bringing a surface of a resin into contact with a surface treating agent containing as an effective component at least one cerium compound selected from tetravalent and trivalent cerium compounds, and thereafter treating the surface with an acidic aqueous solution. This activates the resin surface and thereby increases a strength of adhesion of, for instance, a polyimide-based resin film with metal wires, as well as a strength of adhesion of a polyimide-based resin film with another resin. Thus, a resin surface treating agent that provides excellent productivity and reduces processing costs, as well as a surface treating method using the same, are provided.

17 Claims, 1 Drawing Sheet

RESIN SURFACE TREATING AGENT AND RESIN SURFACE TREATMENT

FIELD OF THE INVENTION

The present invention relates to a surface treating agent for activating a resin surface, as well as to a resin surface treating method.

BACKGROUND OF THE INVENTION

Among wiring boards used in electronic equipment, a flexible printed-circuit board has excellent features such as flexibility, thinness, and lightness of weight. Among the flexible printed-circuit boards, those having a two-layered structure in which polyimide used for forming a base film and copper used for forming a conductive layer are bonded to each other without use of an adhesive has excellently heat-resistance, and therefore is demanded increasingly.

Methods for manufacturing substrates of the above-mentioned two-layered-structure flexible printed-circuit boards include plating, sputtering, casting, and laminating. Among these methods, the plating and the sputtering exhibit greater freedom in selecting a polyimide and easier manufacture.

The plating is a method including a step of forming a conductive thin seed layer on a polyimide film by electroless plating, and a subsequent step of forming a conductive layer of copper. The sputtering is a method including a step of forming a conductive thin seed layer on a polyimide film by sputtering and a subsequent step of forming a conductive layer of copper by electroplating.

For the foregoing plating methods, the semiadditive process is proposed. In the semiadditive process, to obtain intimate adhesion of the electroless copper plated layer with an interlayer insulator, conventionally recesses and projections are formed on a surface of the insulator by applying a chemical agent containing an alkaline permanganic acid solution and the like, and a plated layer is formed on the surface with the recesses and projections.

On the other hand, design pitches have been narrowed with the recent trend of size reduction and improved performance of electronic equipment, and accordingly, higher signal frequencies are used.

In the case where an electroless copper plated layer is formed on a surface with recesses and projections as described above, copper etching residues tend to remain after pattern formation by etching, and particularly in the case where the pattern pitch is narrow, there arises a problem that ion migration and other troubles tend to be induced by etching residues.

Further, when a clock frequency of current running through an electric conductor increases, current runs only in the vicinity of a surface of the conductor due to the skin effect, and here, in the case where recesses and projections are present at an interface between the plated copper layer and the insulator as described above, there arises a problem that signal transfer is retarded in the vicinity of the interface with the recesses and projections.

As an insulator used in the flexible board, a polyimide-based resin is used, and the polyimide substrate has to be brought into close contact with a resin of a bonding sheet, a photosolder resist and the like. However, the contact thereof with the resin greatly varies with the kind of the resin of the counterpart due to the properties of polyimide, and adhesion cannot be achieved at all when the resin is of one of certain specific kinds. Therefore, there has been a problem that the material for the use is limited.

As a method for processing a copper surface to improve the adhesion thereof with a resin, a blackening process (formation of copper oxide using strong-alkali aqueous solution) is performed in some cases. In this method, however, recesses and projections occur on an interface, which is expected to result in problems like those described above.

Further, since polyimide generally provides poor adhesion to a metal, a substrate manufactured by the aforementioned plating or sputtering method has a problem that a polyimide film provides poor adhesion to a seed layer and a copper layer. To cope with this, the following patent publication 1 has proposed that a surface of polyimide is subjected to plasma treatment so that the adhesion thereof to the seed layer and the copper layer is improved.

Patent Publication 1: JP-A-3(1991)-56541

However, the plasma treatment requires a high-priced processing machine and a vacuum atmosphere for the treatment, and hence it has a problem of low productivity.

SUMMARY OF THE INVENTION

Therefore, to solve the problems of the prior art, it is an object of the present invention to provide a surface treating agent for treating a surface of a resin of any one of various kinds that provides excellent productivity and allows low-cost treatment, as well as provides a method for treating a surface of a resin of any one of various kinds that uses the foregoing surface treating agent.

The present invention provides a resin surface treating agent containing as an effective component at least one cerium compound selected from tetravalent and trivalent cerium compounds.

Further, a resin surface treating method of the present invention is characterized in that a surface treating agent that contains as an effective component at least one cerium compound selected from tetravalent and trivalent cerium compounds is brought into contact with a surface of a resin.

DETAILED DESCRIPTION OF THE INVENTION

Figure 1:
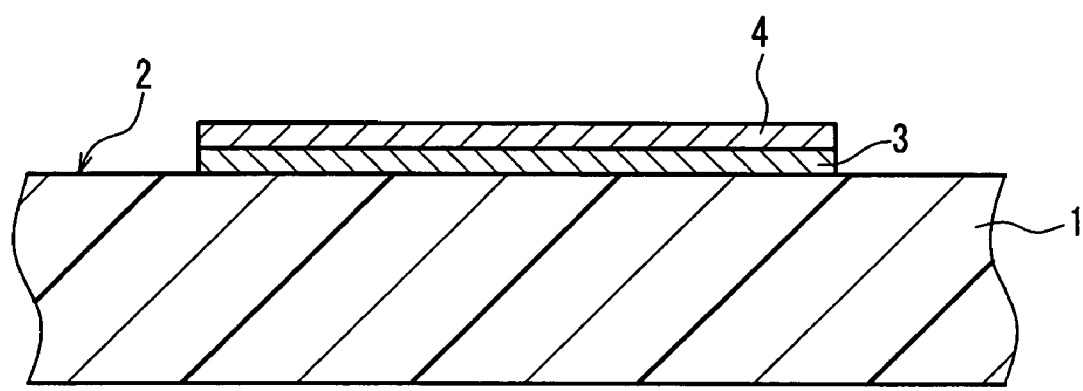
FIG. 1 is a schematic cross-sectional view illustrating that a resin surface is activated, and the activated resin surface is plated electrolessly with copper, and further plated electrically with copper, according to one embodiment of the present invention.

According to the present invention, a resin surface is activated, whereby, for instance, the strength of adhesion of a film of a resin of any one of various kinds such as a polyimide-based resin film to metal wires is improved as well as the strength of adhesion of the resin film to another resin is improved. Further, the present invention provides a resin surface treating agent that provides excellent productivity and allows low-cost treatment, as well as a method for treating a surface of a resin with use of the foregoing treating agent.

The present invention improves the adhesion strength of a resin surface in its smooth state by chemically processing the resin surface without roughening the same. Therefore, it is possible to obtain a resin surface suitable for electronic materials that are suitable for finer patterns and higher clock frequencies. Further, it is possible to improve the close contact between resins that conventionally provide poor contact with each other. It should be noted that a surface of a resin treated with the treating agent of the present invention exhibited no change in its appearance as observed through a scanning electron microscope (SEM) photograph (3500X).

The inventors of the present invention have found that a resin surface comes to have excellent adhesion to a metal, particularly copper, when being brought into contact with an aqueous solution containing a tetravalent and/or trivalent cerium compound(s), and the like. Further, they have found that the surface has excellent adhesion to another resin. Still further, they have found that the surface treating agent of the present invention has an excellent dissolving property for dissolving smear that is produced when holes are bored in a resin with laser or by drilling.

More specifically, the present invention is achieved with the following constitutions:
(1) a resin surface treating agent containing a tetravalent and/or trivalent cerium compound(s) as its effective component; and
(2) a surface treating method wherein a surface treating agent containing a tetravalent and/or trivalent cerium compound(s) as its effective component is brought into contact with a surface of a resin.

Here, the term "effective component" refers to a component accounting for a concentration ranging from 0.01 percent to 50 percent (percent by mass, hereinafter the term "percent (%)" refers to "percent by mass (mass %)"), or 0.00001 mol/kg to 2 mol/kg equivalent to a concentration of cerium.

The present invention is described in detail below.

A tetravalent cerium compound used in the present invention is a component that can reform a surface of a resin so that the surface exhibits excellent adhesion to another member made of a metal or a resin. Further, it is a component that dissolves a smear of the resin. Specific examples of the same include: cerium (IV) hexanitrates such as cerium (IV) diammonium nitrate and potassium cerium (IV) nitrate; cerium (IV) tetraammonium sulfate; and cerium (IV) sulfate. The cerium compounds may be hydrates such as cerium (IV) tetraammonium sulfate dihydrate, and cerium (IV) sulfate tetrahydrate. Two or more of the tetravalent cerium compounds may be used in combination.

The trivalent cerium compound used in the present invention may be any one of cerium (III) acetate, cerium (III) ammonium nitrate, cerium (III) carbonate, cerium (III) chloride, cerium (III) fluoride, cerium (III) nitrate, cerium (III) sulfate, cerium (III) bromide, cerium (III) iodide, cerium (III) oxalate, cerium (III) perchloride, cerium (III) sulfide, and hydrates of the same. Two or more of the foregoing trivalent cerium compounds may be used in combination.

The tetravalent cerium compound(s) and the trivalent cerium compound(s) may be used in combination.

The surface treating agent of the present invention preferably is a solution of a tetravalent and/or trivalent cerium compound(s). A solvent to be used preferably is water, but any solvent, for instance, alcohol, can be used without particular limitation as long as it can dissolve the tetravalent and/or trivalent cerium compound(s).

The following description refers to a case where the surface treating agent of the present invention is in a state of solution as the preferred state.

The concentration of the tetravalent and/or trivalent cerium compound(s) in the surface treating agent preferably is 0.01 mass % to 50 mass % in total, and more preferably 0.1 mass % to 30 mass % in total. In the case where the concentration is less than 0.01 mass %, the reactivity thereof with a resin tends to decrease. In the case where the concentration exceeds 50 mass %, the dissolution of the agent tends to be incomplete. The following describes a case where an aqueous solution is prepared with a cerium compound of the present invention and the concentration is expressed with an effective concentration mol/kg. In this case, a range of an effective concentration of cerium preferably is 0.00001 mol/kg to 2 mol/kg. With the concentration of less than 0.00001 mol/kg, the treatment is ineffective. On the other hand, the compound of the concentration exceeding 2 mol/kg requires heating so as to be dissolved, and even if it is dissolved, stability is very poor. A preferable range of the concentration is 0.0001 mol/kg to 1.5 mol/kg. With the concentration of less than 0.0001 mol/kg, the achievement of the effect is retarded, while the achieved effect and the improvement of adhesion are more or less insufficient. When the concentration is more than 1.5 mol/kg, heating is required. A further preferable range of the concentration is 0.001 mol/kg to 1 mol/kg. With the concentration of less than 0.001 mol/kg, a longer treating time is required, even though the desired effect is achieved eventually. With the concentration of more than 1 mol/kg, the compound tends to be dissolved incompletely without heating. The most preferable concentration is 0.01 mol/kg to 0.9 mol/kg.

Further various additives may be added to the surface treating agent of the present invention. For instance, acids for improving the stability of a cerium compound may be added, such as nitric acid, sulfuric acid, perchloric acid, formic acid, and acetic acid, as well as a surfactant for improving wettability and reactivity with a polyimide-based resin or other resins.

No specific limitation is laid on a range of a concentration of the foregoing strong acid, and the effect of stabilizing a cerium compound is improved with an added amount thereof, though the added amount thereof normally is not more than 50 %, preferably 5 % to 30%. With an excessively high concentration, in the case where a material to be treated is a material in which a resin and a metal coexist, the metal tends to erode.

The surface treating agent of the present invention can be prepared easily, by dissolving the above-mentioned components in a solvent such as water. The water preferably is an ion-exchanged water or the like, from which ionic substances and impurities have been removed.

The resin to be treated with the surface treating agent of the present invention may be any resin. Preferable resins include polyimide-based resins, epoxy-based resins, cyanate-based resins, acryl-based resins, acryl-epoxy-based resins, acryl-butadiene-styrene (ABS)-based resins, aramid-based resins, polyvinyl chloride (PVC)-based resins, polypropylene (PP)-based resins, polycarbonate (PC)-based resins, urethane-based resins, polyethylene (PE)-based resins, and polyamide-based resins. Among these, particularly the polyimide-based resins are used preferably. No specific limitation is laid on the polyimide-based resins, and any resin having an imide structure may be used, for instance, polypyromellitic acid imide, polybiphenyl imide, polyketone imide, polyamide imide, polyester imide, polyether imide, polyamide ester imide, polyimidazopyrrolone imide, polyhydantoin imide, polyoxazole imide, cyanate-modified bismaleimide, or silicone-modified polyimide.

When a surface of a polyimide-based resin is treated with the surface treating agent of the present invention, it is preferable that the surface of the polyimide-based resin is treated preliminarily with an alkaline aqueous solution that dissolves sodium hydroxide, potassium hydroxide, monoethanolamine, or the like so that the surface has higher wettability.

As a method for bringing the surface treating agent of the present invention with a surface of a resin, spraying, showering, immersion, or the like may be used.

The conditions for bringing the surface treating agent and the surface of the resin in contact with each other are not limited specifically, but normally the temperature of the surface treating agent preferably is 20° C. to 50° C., and the time while they are in contact preferably is 1 minute to 30 minutes.

Residues of a cerium compound tend to adhere to a surface of a resin that has been treated with the surface treating agent of the present invention, and hence, it is preferable that the residues are dissolved in an acidic aqueous solution so as to be removed therefrom, and the surface is washed with water and dried.

Basically, the trivalent cerium compounds produce the same effect as that of the tetravalent cerium compounds, but the trivalent cerium compounds have an advantage that fewer residues remain on a resin surface after the surface treatment. Therefore, in the case where trivalent cerium compounds are used, the foregoing finishing step with an acid is not required.

Examples of the acidic aqueous solution include aqueous solutions of sulfuric acid, hydrochloric acid, and nitric acid. The acidic aqueous solution preferably has a concentration of about 0.01% to 50%.

The conditions for the treatment with the acidic aqueous solution are not limited specifically, but normally immersion at 20° C. to 50° C. for 2 minutes to 30 minutes is performed.

A resin treated with the surface treating agent of the present invention has improved adhesion to another member made of, for instance, a metal, a resin, ceramic, or glass. Examples of the metal include an electrolessly plated film of copper, nickel/chromium alloy, or aluminum, a sputtering film, and a vapor deposition film. Examples of the foregoing resin include phenol resins, epoxy resins, heat-resistant epoxy resins, cyanate-modified bismaleimide resins, silicon carbide resins, polyphenylene ether, polyimide-based resins, and liquid crystal polymer.

Examples of preferable combinations include:

Resin—metal: polyimide resin—copper, epoxy resin—copper, cyanate resin—copper, aramid resin—copper, ABS resin—nickel Resin—resin: polyimide resin—epoxy resin, polyimide resin—(acryl-epoxy) resin Preferable resins are polyimide resins, epoxy resins, cyanate resins, acrylic (acryl-epoxy) resins, ABS resins, and aramid-based resins.

Examples of specific uses of the foregoing combinations are as follows:

(1) Epoxy resin or cyanate resin—copper:

An interface between an insulation layer (epoxy resin or cyanate resin) and a conductive layer (copper) or the like in a multilayer printed circuit board. Here, Examples of the multilayer printed circuit board include a board obtained by impregnating a glass fiber fabric with an epoxy resin, and a board obtained by impregnating an aramid fiber non-woven fabric with an epoxy resin.

(2) Polyimide resin—epoxy resin, or polyimide resin, or cyanate resin:

An interface between a solder resist (epoxy) and a polyimide substrate, or an interface between a polyimide substrate and a bonding sheet (epoxy, polyimide, or cyanate) for bonding the foregoing polyimide substrate with a polyimide substrate in an upper layer in a lamination process for forming a multilayer printed circuit board.

(3) Epoxy resin—acrylic resin or acryl-epoxy resin:

An interface between a solder resist (epoxy) and a marking ink (acryl, acryl-epoxy) when a surface of the solder resist is subjected to marking printing.

(4) Epoxy resin—epoxy resin (5) An interface between a solder resist (epoxy) surface and a mold resin (epoxy):

The surface treating agent of the present invention serves a useful function in, for instance, improving adhesion of a polyimide-based resin film to a conductive layer in a two-layer flexible circuit board configured by laminating the resin film and the conductive layer. Further, it also serves a useful function in improving adhesion of a polyimide-based resin film to an adhesive in a three-layer flexible circuit board configured by laminating a conductive layer on the polyimide-based resin film via the adhesive. Still further, it also serves a useful function in improving adhesion between polyimide-based resin layers and conductive layers in a multilayer flexible circuit board configured by laminating a plurality of the polyimide-based resin layers and the conductive layers alternately. Still further, it also serves a useful function in improving adhesion of a protective film made of a polyimide-based resin to an underfill agent when a semiconductor device on which the protective film is formed is mounted directly on a printed circuit board. Still further, it also serves a useful function in improving adhesion of an etching resist to a substrate made of a polyimide-based resin when the polyimide-based resin substrate is coated with the etching resist for forming via holes therein. Still further, it also serves a useful function in improving adhesion of a substrate made of a polyimide-based resin in a flexible printed circuit board or a flex/rigid printed circuit board to a coverlay. Still further, it also serves a useful function in improving adhesion to a solder resist that protects a surface of a circuit board, or adhesion to a bonding film as an interlayer insulation resin in a multilayer flexible circuit board. Besides, it is applicable in a circuit board in an image display device, such as a substrate of a liquid crystal display device or a substrate of an electroluminescent device.

Still further, the surface treating agent of the present invention serves a useful function in removing smear that is produced when holes are bored in resins of various kinds such as polyimide with laser or by drilling.

FIG. 1 is a schematic cross-sectional view illustrating that a surface 2 of a resin 1 is activated, and the activated surface is plated electrolessly with copper (designated by numeral 3), and further plated electrically with copper (designated by numeral 4), according to one example of the present invention.

EXAMPLES

Examples 1 To 7 And Comparative Examples 1 To 2

These examples were intended to test adhesion between a copper plated film and a resin in the case where various cerium compounds were used.

Polyimide films with a thickness of 25 µm each (produced by Toray-DuPont, product name: Kapton 100EN) were immersed in a 5% sodium hydroxide aqueous solution for 5 minutes and then washed with water. The films obtained were immersed in treating solutions formulated as shown in Table 1 below at 50° C. for 5 minutes and then washed with water. Subsequently, the films were immersed in a 30% sulfuric acid aqueous solution for 5 minutes and then washed with water, and dried.

A face on one side of each polyimide film thus treated was plated with copper electrolessly, whereby an electroless copper plated film with a thickness of 0.15 μm was formed. Subsequently, it was subjected to copper electroplating, whereby a copper film with a thickness of 35 μm in total was formed thereon, and then, heated at 150° C. for 30 minutes. It should be noted that the heating after the plating was intended to stabilize the crystal structure of the copper film.

The comparative example 1 is an example in the case where the cerium compound concentration was low, while the comparative example 2 is an example in the case where no cerium compound was used.

Then, a strength (hereinafter referred to as peel strength) of a power required for peeling a copper plated film away from a polyimide film was measured according to JIS C 6481. The results are shown in Table 1 below.

TABLE 1

| Example | Formulation | (mass %) | Peel strength (kgf/cm) |
|---|---|---|---|
| Ex. 1 | cerium (IV) diammonium nitrate (Ce concentration: 0.002 mol/kg) | 0.1 | 1.17 |
| | nitric acid | 6.75 | |
| | ion-exchanged water | the rest | |
| Ex. 2 | cerium (IV) diammonium nitrate (Ce concentration: 0.089 mol/kg) | 5 | 1.20 |
| | perchloric acid | 7 | |
| | ion-exchanged water | the rest | |
| Ex. 3 | cerium (IV) diammonium nitrate (Ce concentration: 0.531 mol/kg) | 30 | 1.09 |
| | perchloric acid | 18 | |
| | ion-exchanged water | the rest | |
| Ex. 4 | cerium (IV) tetraammonium nitrate (Ce concentration: 0.200 mol/kg) | 12.7 | 0.89 |
| | sulfuric acid | 6.25 | |
| | ion-exchanged water | the rest | |
| Ex. 5 | cerium (IV) nitrate (Ce concentration: 0.300 mol/kg) | 12.1 | 0.79 |
| | sulfuric acid | 12.5 | |
| | ion-exchanged water | the rest | |
| Ex. 6 | cerium (IV) diammonium nitrate (Ce concentration: 0.053 mol/kg) | 3 | 1.20 |
| | cerium (III) nitrate (Ce concentration: 0.069 mol/kg) Ce concentration in total: 0.122 mol/kg | 3 | |
| | ion-exchanged water | the rest | |
| Ex. 7 | cerium (III) nitrate (Ce concentration: 0.100 mol/kg) | 4.3 | 1.09 |
| | nitric acid | 6.0 | |
| | ion-exchanged water | the rest | |
| Comp. Ex. 1 | cerium (IV) diammonium nitrate (Ce concentration: 0.000007 mol/kg) | 0.00035 | below the measurement limit (0.02 or less) |
| | nitric acid | 1 | |
| | ion-exchanged water | the rest | |
| Comp. Ex. 2 | non-treated | | below the measurement limit (0.02 or less) |

As shown above, the samples of the present examples were characterized in that greater forces were required for peeling copper plated films away from polyimide films, and thus it was confirmed that the adhesion thereof was improved.

Examples 8 To 11 And Comparative Example 3

These examples and comparative examples were intended to test adhesion of an acryl-epoxy resin and an acrylic resin.

As Examples 8 to 11, epoxy-resin-impregnated glass fabric substrates with 18-μm-thick copper foils laminated on both faces of each were prepared with an acryl-epoxy resin (solder resist PSR-4000 Z 26 produced by TAIYO INK MFG. CO., LTD.) being applied on one of the faces of each substrate.

These samples were immersed in treating solutions prepared as shown in Table 2 below at 40° C. for 1 minute, and then, washed with water and dried. Subsequently, a UV-curable marking ink (produced by TAIYO INK MFG. CO., LTD., product name: UVR-110W) was applied over the acryl-epoxy resin surfaces, and the ink was exposed to ultraviolet light (light exposure: 1200-1300 mj) by an exposing machine (available from Nanometric Technology Inc., type: ES-20m) so that the ink was cured by ultraviolet light. After the ultraviolet curing, they were subjected to heat treatment at 150° C. for 10 minutes.

A sample as Comparative Example 3 was prepared in the same manner as above except that the formulation of the solution in which it was immersed after the acryl-epoxy resin was applied was substituted with the solution shown in Table 2, the column for Comparative Example 3.

Thereafter, a crosscut (2 mm square) tape peel test (method according to JIS C5012) was carried out. The results are shown in Table 2 below.

TABLE 2

| Example | Formulation | | Result |
|---|---|---|---|
| Ex. 8 | cerium (III) nitrate hexahydrate (Ce: 0.128 mol/kg) | 5.6 mass % | Good |
| | nitric acid | 13.5 mass % | |
| | ion-exchanged water | the rest | |
| Ex. 9 | cerium (III) nitrate hexahydrate (Ce: 0.256 mol/kg) | 11.1 mass % | Good |
| | nitric acid | 13.5 mass % | |
| | ion-exchanged water | the rest | |
| Ex. 10 | cerium (III) chloride heptahydrate (Ce: 0.128 mol/kg) | 4.8 mass % | Good |
| | nitric acid | 13.5 mass % | |
| | ion-exchanged water | the rest | |
| Ex. 11 | cerium (III) chloride heptahydrate (Ce: 0.256 mol/kg) | 9.5 mass % | Good |
| | nitric acid | 13.5 mass % | |
| | ion-exchanged water | the rest | |
| Comp. Ex. 3 | nitric acid | 13.5 mass % | No-good |
| | ion-exchanged water | the rest | |

Evaluation criteria for Table 2:
Good: No peeling-off occurred.
No-good: Peeling-off occurred.

As is clear from Table 2, regarding Examples 8 to 11, no peeling-off occurred between the acryl-epoxy resin and an acrylic resin.

Examples 12 To 16 And Comparative Examples 4 To 8

This experiment was intended to test adhesion of an epoxy resin, a cyanate resin, and an aramid resin to copper.

Three types of epoxy resin sheets 1 to 3, a cyanate resin sheet, and an aramid resin sheet, each of which was 40 μm thick, were laminated with heat and pressure on faces on one side of the same copper-foil-laminated substrates (substrates for the resin sheets) as those of Examples 8 to 11, respectively, and these copper-resin laminates were immersed in a 5% sodium hydroxide aqueous solution for 5 minutes, and washed with water.

Subsequently, these laminates were immersed in treating solutions formulated as shown below at 50° C. for 5 minutes, and washed with water. Then, they were immersed in a 30% sulfuric acid aqueous solution for 5 minutes, washed with water, and dried, whereby Examples 12 to 16 were prepared.

| Treating solution: | cerium (III) nitrate (cerium concentration: 0.1 mol/kg) | 5.64 mass % |
| --- | --- | --- |
| | nitric acid | 6.7 mass % |
| | ion-exchanged water | the rest |

It should be noted that the three types of epoxy resin sheets were obtained by forming resins containing different types and formulated amounts of additives in sheet form.

On the other hand, copper-resin laminates obtained by applying the foregoing three types, i.e., the epoxy resin sheets, the cyanate resin sheet, and the aramid resin sheet over the copper-foil-laminated substrates, respectively, in the same manner with heat and pressure were prepared as Comparative Examples 4 to 8.

A face on one side of each laminate of Examples and Comparative Examples was plated electrolessly with copper so that a copper layer with a thickness of 0.15 μm was formed. Thereafter it was plated electrically with copper, whereby a copper layer with a thickness of 35 μm in total was formed, and was heated at 150° C. for 30 minutes. Visual observation was made on states of resin-side surfaces of these laminates after the plating, and the states were evaluated. The results of the evaluation are shown in Table 3 below.

TABLE 3

| | Type of resin | Evaluation |
| --- | --- | --- |
| Ex. 12 | epoxy-based resin 1 | Good |
| Ex. 13 | epoxy-based resin 2 | Good |
| Ex. 14 | epoxy-based resin 3 | Good |
| Ex. 15 | cyanate-based resin | Good |
| Ex. 16 | aramid-based resin | Good |
| Comp. Ex. 4 | epoxy-based resin 1 | No-good |
| Comp. Ex. 5 | epoxy-based resin 2 | No-good |
| Comp. Ex. 6 | epoxy-based resin 3 | No good |
| Comp. Ex. 7 | cyanate-based resin | No-good |
| Comp. Ex. 8 | aramid-based resin | No-good |

Evaluation criteria for Table 3:
Good: No peeling-off occurred.
No-good: Peeling-off occurred.

As is clear from Table 3, regarding Examples 12 to 16, no peeling-off occurred between the copper layers and the resins.

Examples 17 And 18 and Comparative Examples 9 And 10

This experiment was intended to test adhesion of polyimide resins and epoxy resins.

The same polyimide films as those of Examples 1 to 7 were immersed in a 5% sodium hydroxide aqueous solution for 5 minutes and washed with water. The films obtained were immersed in treating solutions formulated as shown below at 50° C. for 5 minutes and then washed with water. Subsequently, the films were immersed in a 30% sulfuric acid aqueous solution for 5 minutes and then washed with water, and dried.

| Treating solution: | cerium (III) nitrate (cerium concentration: 0.1 mol/kg) | 5.64 mass % |
| --- | --- | --- |
| | nitric acid | 6.7 mass % |
| | ion-exchanged water | the rest |

An epoxy resin sheet was laminated with heat and pressure on a face on one side of each of the obtained films and non-treated polyimide films as comparative examples, whereby polyimide-epoxy resin laminated sheets were formed.

Among the laminated sheets, those of the treated films constituted Examples 17 and 18, while those of the non-treated films constituted Comparative Examples 9 and 10. These examples and comparative examples were subjected to the crosscut (2 mm square) tape peel test (method according to JIS C5012) in the same manner as that for Example 8, and the results were evaluated, which are shown in Table 4 below.

TABLE 4

| | Type of resin | Evaluation |
| --- | --- | --- |
| Ex. 17 | epoxy-based resin 4 | Good |
| Ex. 18 | epoxy-based resin 5 | Good |
| Comp. Ex. 9 | epoxy-based resin 4 | No-good |
| Comp. Ex. 10 | epoxy-based resin 5 | No-good |

Evaluation criteria for Table 4:
Good: No peeling-off occurred.
No-good: Peeling-off occurred.

As is clear from Table 4, regarding Examples 17 and 18, no peeling-off occurred between the polyimide resin and the epoxy resin.

Example 19 And Comparative Example 11

This experiment was intended to test the adhesion between ABS and nickel.

An ABS mold (a plate with a size of 10×10 cm and a thickness of 2 cm) was immersed in a 5% sodium hydroxide aqueous solution for 5 minutes, and was washed with water.

Thereafter, it was immersed in a treating solution formulated as shown below at 50° C. for 5 minutes, and then, washed with water. Subsequently, it was immersed in a 30% sulfuric acid aqueous solution for 5 minutes, washed with water, and dried, whereby Example 19 was formed.

| Treating solution: | cerium (III) nitrate (cerium concentration: 0.1 mol/kg) | 5.64 mass % |
| --- | --- | --- |
| | nitric acid | 6.7 mass % |
| | ion-exchanged water | the rest |

The ABS mold thus prepared was immersed in a solution prepared with palladium chloride, tin chloride, and hydrochloric acid for 2 minutes, then treated with sulfuric acid at 30° C. for 3 minutes, and thereafter, a 1-μm-thick nickel plated layer was formed thereon by electroless nickel plating.

On the other hand, the same ABS mold as that used for forming Example 19 above was prepared without the foregoing treatment, as Comparative Example 20. A nickel plated layer was formed thereon by electroless plating through the same treatment as that for Example 19 except that it was not immersed in the above-described treating solution.

After the plated layers were formed, surfaces plated with nickel were subjected to the crosscut (2 mm square) tape peel test (method according to JIS C5012) in the same manner as that for Example 8, and the results were evaluated, which are shown in Table 5 below.

TABLE 5

|  | Type of resin | Evaluation |
| --- | --- | --- |
| Ex. 19 | ABS resin 4 | Good |
| Comp. Ex. 11 | ABS resin 5 | No-good |

Evaluation criteria for Table 5:
Good: No peeling-off occurred.
No-good: Peeling-off occurred.

As is clear from Table 5, regarding Example 19, no peeling-off occurred between nickel and the ABS resin.

Thus, the present invention serves a useful function in such fields as those where improved adhesion strength is required between metal wires and flexible printed circuit boards or fiber-reinforcing-resin impregnated substrates, between resins, and between resin films and metal wires.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A resin surface treating agent for treating a surface of a first resin, comprising:
    as an effective component at least one cerium compound selected from tetravalent and trivalent cerium compounds, the resin surface treating agent being capable of activating the surface of the first resin so as to enhance a close contact of the surface of the first resin with a surface of another member made of a metal or a second resin; and
    a carrier for said effective component suitable for delivering the effective component into contact with the surface of the first resin and then being removed,
    wherein the tetravalent cerium compound is at least one selected from cerium (IV) hexanitrates, cerium (IV) tetraarmmonium sulfate, and cerium (IV) sulfate, and the trivalent cerium compound is at least one selected from cerium (III) acetate, cerium (III) ammonium nitrate, cerium (III) carbonate, cerium (III) chloride, cerium (III) fluoride, cerium (III) nitrate, cerium (III) sulfate, cerium (III) bromide, cerium (III) iodide, cerium (III) oxalate, cerium (III) perchloride, cerium (III) sulfide, and hydrates of the same.

2. The resin surface treating agent according to claim 1, the treating agent being a solution containing the at least one cerium compound selected from the tetravalent and trivalent cerium compounds.

3. The resin surface treating agent according to claim 2, wherein the solution is an aqueous solution.

4. The resin surface treating agent according to claim 2, wherein
    a concentration of the at least one cerium compound selected from the tetravalent and trivalent cerium compounds in the solution is in a range of 0.01 percent by mass to 50 percent by mass.

5. The resin surface treating agent according to claim 2, wherein
    a concentration of the at least one cerium compound selected from the tetravalent and trivalent cerium compounds in the solution is in a range of 0.00001 mol/kg to 2 mol/kg equivalent to a concentration of cerium.

6. The resin surface treating agent according to claim 1, wherein
    the resin is at least one selected from polyimide-based resins, epoxy-based resins, cyanate-based resins, acryl-based resins, ABS-based resins, aramid-based resins, and mixtures of any of the same.

7. A resin surface treating method comprising:
    (a) bringing a surface treating agent into contact with a surface of a first resin, the surface treating agent activating the surface of the first resin so as to enhance a close contact of the surface of the first resin with a surface of another member made of a metal or a second resin, the surface treating agent containing as an effective component at least one cerium compound selected from tetravalent and trivalent cerium compounds,
    wherein the tetravalent cerium compound is at least one selected from cerium (IV) hexanitrates, cerium (IV) tetraammonium sulfate, and cerium (IV) sulfate, and the trivalent cerium compound is at least one selected from cerium (III) acetate, cerium (III) ammonium nitrate, cerium (III) carbonate, cerium (III) chloride, cerium (III) fluoride, cerium (III) nitrate, cerium (III) sulfate, cerium (III) bromide, cerium (III) iodide, cerium (III) oxalate, cerium (III) perchloride, cerium (III) sulfide, and hydrates of the same.

8. The resin surface treating method according to claim 7, wherein the surface treating agent is a solution.

9. The resin surface treating method according to claim 8, wherein the solution contains a tetravalent cerium compound,
    the method Farther comprising:
    (b) treating the surface of the resin with an acidic aqueous solution, the step (b) being carried out after the step (a).

10. The resin surface treating method according to claim 8, further comprising:
    (c) treating the surface of the resin with an alkaline aqueous solution, the step (c) being carried out before the step (a).

11. The resin surface treating method according to claim 8, wherein
    the solution containing at least one cerium compound selected from the tetravalent and trivalent cerium compounds is an aqueous solution.

12. The resin surface treating method according to claim 8, wherein
    a concentration of the at least one cerium compound selected from the tetravalent and trivalent cerium compounds in the solution is in a range of 0.01 percent by mass to 50 percent by mass.

13. The resin surface treating method according to claim 8, wherein
    a concentration of the at least one cerium compound selected from the tetravalent and trivalent cerium compounds in the solution is in a range of 0.00001 mol/kg to 2 mol/kg equivalent to a concentration of cerium.

14. The resin surface treating method according to claim 7, wherein
    the resin is at least one selected from polyimide-based resins, epoxy-based resins, cyanate-based resins, acryl-based resins, ABS-based resins, aramid-based resins, and mixtures of any of the same.

15. The resin surface treating agent according to claim 1, wherein the another member is made of at least one selected from copper, polyimide-based resins, epoxy-based resins, cyanate-based resins, acryl-based resins, ABS-based resins, aramid-based resins, and mixtures of any of the same.

16. The resin surface treating method according to claim 7, wherein the another member is made of at least one selected from copper, polyimide-based resins, epoxy-based resins, cyanate-based resins, acryl-based resins, ABS-based resins, aramid-based resins, and mixtures of any of the same.

17. The resin surface treating method according to claim 7, further comprising bringing the surface of the first resin and the surface of the another member together after the surface of the first resin has been treated.

* * * * *